United States Patent
Plank et al.

(10) Patent No.: US 12,292,365 B2
(45) Date of Patent: May 6, 2025

(54) SAMPLE HOLDER FOR HOLDING A SAMPLE CARRIER CARRYING A SAMPLE

(71) Applicant: LEICA Mikrosysteme GmbH, Vienna (AT)

(72) Inventors: Heinz Plank, Wetzlar (DE); Tim Laugks, Schenefeld (DE); Ulrike Laugks, Schenefeld (DE); Roland Thuenauer, Jork (DE)

(73) Assignee: LEICA MIKROSYSTEME GMBH, Vienna (AT)

( * ) Notice: Subject to any disclaimer, the term of this patent is extended or adjusted under 35 U.S.C. 154(b) by 451 days.

(21) Appl. No.: 18/045,179

(22) Filed: Oct. 10, 2022

(65) Prior Publication Data

US 2023/0120051 A1    Apr. 20, 2023

(30) Foreign Application Priority Data

Oct. 15, 2021    (EP) .................................... 21202905

(51) Int. Cl.
*G01N 1/42*    (2006.01)
(52) U.S. Cl.
CPC ..................................... *G01N 1/42* (2013.01)
(58) Field of Classification Search
CPC ................ G01N 1/42; H01J 2237/2007; H01J 2237/201; H01J 2237/26; H01J 37/20; G02B 21/34
See application file for complete search history.

(56) References Cited

U.S. PATENT DOCUMENTS

| | | |
|---|---|---|
| 2,120,404 A | 6/1938 | Graff |
| 10,144,010 B2 | 12/2018 | Lihl et al. |
| 2016/0030941 A1* | 2/2016 | Lihl .......................... B01L 9/00 422/562 |
| 2018/0290144 A1* | 10/2018 | Lihl ........................... B01L 9/52 |
| 2020/0273659 A1* | 8/2020 | Van Den Boogaard ..................... H01J 37/20 |
| 2022/0319801 A1* | 10/2022 | Vaske ...................... H01J 37/20 |

FOREIGN PATENT DOCUMENTS

| | | |
|---|---|---|
| DE | 102015108898 A1 | 12/2016 |
| DE | 102020211249 A1 * | 3/2022 |
| EP | 3385771 A1 | 10/2018 |

* cited by examiner

*Primary Examiner* — Francis C Gray
(74) *Attorney, Agent, or Firm* — LEYDIG, VOIT & MAYER, LTD.

(57) ABSTRACT

A sample holder for holding a sample carrier carrying a sample includes a sample carrier fixing element. The sample carrier fixing element includes a first section configured, when in a first position, to fix the sample carrier to the sample holder, and, when in a second position, to release the sample carrier or to provide access to an area where the sample carrier is to be located. The sample carrier fixing element also includes a second section different from the first section, the second section being operable such that upon operation of the second section the first section switches from the first position into the second position or from the second position into the first position.

16 Claims, 8 Drawing Sheets

SAMPLE HOLDER FOR HOLDING A SAMPLE CARRIER CARRYING A SAMPLE

CROSS REFERENCE TO RELATED APPLICATIONS

This application claims benefit to European Patent Application No. EP 21202905.2, filed on Oct. 15, 2021, which is hereby incorporated by reference herein.

FIELD

The present inventive concept relates to a sample holder for holding a sample carrier carrying a sample, the sample holder comprising a sample carrier fixing element.

BACKGROUND

Cryo-microscopy in the meaning of the present application particularly includes cryo-light microscopy and cryo-electron microscopy. Samples to be examined by cryo-microscopy are mostly prepared beforehand by a method called cryofixation. In this method, a water-containing sample is frozen very quickly (cryofixed) to a temperature of less than ~150° C., i.e. it is cooled very rapidly in order to avoid the formation of ice crystals. Cryofixation has proven to be particularly suitable for investigations of structural biology. The objects to be investigated, for examples cells, enzymes, viruses, or lipid layers, thereby become embedded in a thin, vitrified ice layer. The great advantage of cryofixation is that the biological structures can be obtained in their natural state. For example, a biological process can be halted at any point in time by cryofixation, and investigated in that vitrified state, for example in a cryo-electron microscope but also in a light microscope with corresponding sample cooling. In this context, cryo-light microscopy serves principally to locate relevant regions of the sample (regions of interest), which can be noted and then re-localised and viewed in more detail in a cryo-electron microscope.

In order not to impair the quality of the frozen samples, it is advantageous that they be transferred in cooled and contamination-free, particularly water-free, fashion between the processing units being used, for example a cryofixation device, a freeze fracture apparatus, and a coating apparatus, and the analytical devices, in this case principally a cryo-light microscope and a cryo-electron microscope. Sample transfer devices, such as disclosed in U.S. Pat. No. 10,144,010 B2, can be used to transfer a sample under cryogenic conditions between said processing units and/or analysing units.

Cryofixation as discussed above may be done on the sample carried by the sample carrier/grid. The grids typically comprise a metal mesh or metal grid (e.g. made of copper or gold) and a support film (e.g. a carbon web). After placing the samples on the grids, samples are cryofixed. Such grids also sometimes referred to as "baregrids." For ease of handling, the thin grids may be clamped into special metal frames. The combined structure of sample grid and metal frame is also known as "autogrid." It is noted that also other kinds of sample carriers, also in the field of cryo-microscopy, are in use.

In a next step, the sample carrier carrying the vitrified sample is loaded into a sample holder. In the example discussed above, one or more grids are placed onto or loaded into the sample holder/cartridge. In order not to impair the quality of the frozen samples, it is advantageous that they be transferred in cooled and contamination-free, particularly water-free, fashion. To this end, the grids are preferably loaded into the cartridge in an atmosphere of cold vaporized liquid nitrogen in the inside of a sample holder transfer device, also known as "shuttle".

A sample holder configured to receive a sample carrier/grid carrying a vitrified sample is disclosed in EP 3 385 771 A1. The sample holder comprises sample carrier fixing means for clamping a sample carrier between a leaf spring biased towards the loading position of the sample carrier, and an edge at the contact surface of the sample holder, at the opposite side of the leaf spring. In order to load a sample carrier into such a sample holder, the sample carrier grabbed by a pair of tweezers is pressed with its opposite side against the leaf spring such that the leaf spring allows placing the sample carrier onto the contact surface of the sample holder. The sample carrier is then lowered onto the contact surface such that the opposite side of the sample carrier contacts the recess formed by the edge such that clamping of the sample carrier is achieved and the pair of tweezers can be removed. For optimal results in the cryo-microscopy workflow, the sample carrier has to be picked up in the right spatial orientation by the pair of tweezers as no adjustment of the sample carrier orientation is possible after it has been loaded into its position onto the sample holder. In the above example, the shuttle may then be connected to a cryo-microscope and the sample holder/cartridge carrying the sample carrier is transferred into the cryo-microscope for examination.

For further examination or for processing the sample, the sample carrier is removed from the sample holder/cartridge in the reverse order. Loading and unloading of the sample carrier has to take place at cryogenic temperatures and as quickly as possible in order to avoid devitrification or contamination of the sample.

SUMMARY

In an embodiment, the present disclosure provides a sample holder for holding a sample carrier carrying a sample. The sample holder includes a sample carrier fixing element. The sample carrier fixing element includes a first section configured, when in a first position, to fix the sample carrier to the sample holder, and, when in a second position, to release the sample carrier or to provide access to an area where the sample carrier is to be located. The sample carrier fixing element also includes a second section different from the first section, the second section being operable such that upon operation of the second section the first section switches from the first position into the second position or from the second position into the first position.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
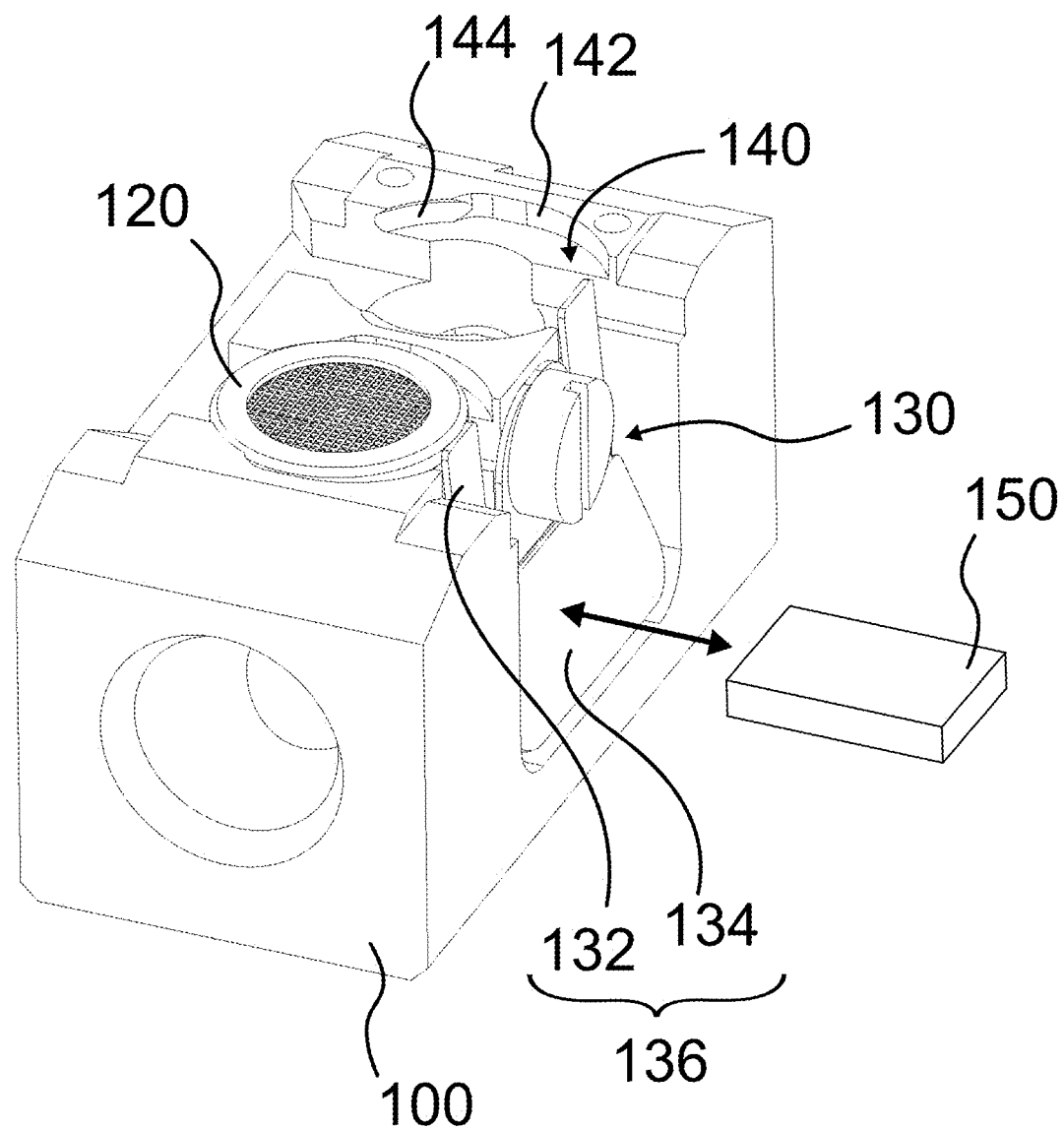
FIG. 1 schematically shows a sample holder according to an embodiment of the present invention, the first section of the sample carrier fixing element of the sample holder being in a first fixing position.

Embodiments of the present invention provide an improved sample holder. More particular embodiments of the sample holder can be used in the form of a cartridge, in which at least one sample carrier, for instance, in the form of a sample grid, can be inserted, the at least one grid carrying a sample, particularly for being processed and/or analysed in cryo-microscopy.

Embodiments of the present invention provide the sample holder for holding a sample carrier carrying a sample which comprises a sample carrier fixing element configured to fix the sample carrier to the sample holder, the sample carrier fixing element comprising a first section configured, when in a first position, to fix or secure the sample carrier to the sample holder, and, when in a second position, to release the sample carrier or to provide access to an area where a sample carrier is to be located; the sample carrier fixing element further comprising a second section different from the first section and being operable such that upon operation of the second section the first section switches from the first into the second position or from the second into the first position.

As the sample carrier fixing element can comprise two sections, namely a first and a second section, the second section can be operated in order to switch the first section into a position where it either fixes or releases the sample carrier. Thus, operation of the sample carrier fixing element is decoupled from its function to either fix or release the sample carrier. In other words, it is no longer necessary to press the sample carrier fixing element with the sample carrier itself into a position where the sample carrier can be placed onto the corresponding contact surface provided in the sample holder. In contrast, a different section of the sample carrier fixing element can now be operated to switch the first (fixing) section into its open (second) position in order to be able to properly locate and orientate the sample carrier. In a next step, the first section may either automatically or by itself return or move into the first (fixing) position, or the first section switches into this first position upon (another) operation of the second section of the sample carrier fixing element. Thus, the process of opening the sample carrier fixing member does no longer depend on the hitherto manual process of inserting the sample carrier(s).

A sample holder according to an embodiment of the present invention provides the opportunity for a simplified loading/unloading process of a sample carrier and further, in particular, provides a flexible and user-friendly way of inserting sample carriers like sample grids into a sample holder like a cartridge used in cryo-microscopy.

The sample carrier fixing element provided in an embodiment of the present invention may consist of or comprise a spring element or a resilient element or an elastic element but also a rigid element, which itself is fixed to the body of the sample holder or is an integral part of the sample holder. Alternatively or additionally, the sample carrier fixing element, particularly its first section, may consist of or comprise a clamp or a clip, either being fixed to the body of the sample holder or being an integral element of the sample holder, for securing the sample carrier. Further, it is conceivable to implement the second section of the sample carrier fixing element in the form of a push button, rotary button, resilient switch, snap switch or the like.

The sample carrier fixing element may comprise an essentially rigid element being configured to have the function of a lever or being formed as a lever, said lever being pivotable around an axis between the first and second sections such that the first section moves or pivots when the second section is moved or pivoted.

In an embodiment, the sample carrier fixing element comprises an essentially resilient element having a first section and a second section, said sections preferably being at opposite ends of the resilient element, the resilient element being configured (in a lever-like fashion) such that the first section moves or pivots when the second section is moved or pivoted. The first section of the sample carrier fixing element may be in the form of a (retaining) leaf spring biased towards the designated area or position of the sample carrier, and the second section may be in the form of another leaf spring (or another resilient part) in connection with the first section, as will also be described in more detail below.

Generally, the second section is operable in order to switch or move the first section at least from one position into another. Such an "operation of the second section" may consist of or comprise at least one of a pressing, a pivoting, a rotary, a pulling and a touching operation. Different configurations are conceivable, e.g., pushing the second section moves the first section into the second open position and pulling the second section moves the first section into the first fixing position; pulling the second section moves the first section into the second open position, and pushing the second section moves the first section into the first fixing position. Further, a pivotable lever or a lever-like movement can be realized as described above. The second section may also be realised as a touch button, which is touched in order to cause the first section to switch from one position into another. Finally, in an embodiment, upon operating the second section, the first section switches into the second position such that a sample carrier can be inserted or located into or onto the sample holder, and, if the second section is not operated, the first section moves by itself into the first fixing position in order to fix the sample carrier to the sample holder.

In case of the above described example of an "autogrid" having a circumferential metal frame, in order to secure the sample carrier in its position, it is often sufficient if the first section of the sample carrier fixing element presses against one side of the "autogrid," which is then clamped between the first section of the sample carrier fixing element and, at its opposite side, an edge or an undercut of the (recessed) area where the sample carrier is located. In this case, the fixing force of the first section of the sample carrier fixing element mainly acts in a direction parallel to the main surface of the sample carrier.

It is noted that any kind of grid, also an above mentioned "baregrid," can be secured in its position by a first section of the sample carrier fixing element, which first section comprises a bifurcated part, which extends along the two sides and above at least a part of the upper surface of the sample carrier. In this case, the fixing force of the first section of the sample carrier fixing element mainly acts in a direction "from above downward", i.e. perpendicular to the main surface of the sample carrier.

In an embodiment, the second section of the sample carrier fixing element is operable from a direction different from the main direction of the first section moving into its second open position. Preferably, the sample carrier fixing element is operable from a direction essentially opposite to (see "autogrid" example below) or perpendicular to (see "baregrid" example below) the main moving direction of the first section when moving into its second open position. The "main moving direction" here is oppositely directed to the main direction of the fixing force of the first section as defined above in the examples of an "autogrid" and a "baregrid".

As, in this embodiment, the direction of operation of the second section is different from the main opening direction of the first section when releasing the sample carrier or when providing access to the area where the sample carrier is to be located, the movement for inserting the sample carrier and the operation for opening the sample carrier fixing element are further decoupled. This further improves the flexible and user-friendly way of handling sample carriers in the sample holder of the present inventive concept. In this embodiment, for instance, by pressing the second section of the sample carrier fixing element an opening of the first section of the sample carrier fixing element into a direction essentially opposite to the direction of pressing the second section can be achieved, which facilitates inserting and removing of sample carriers like "autogrids" into or from the sample holder. In another example, by pressing the second section of the sample carrier fixing element an opening of the first section of the sample carrier fixing element into a direction essentially perpendicular to the direction of pressing the second section can be achieved, which facilitates inserting and removing of sample carriers like "baregrids" into or from the sample holder. More generally, the first section preferably moves backwards and/or upwards into its second position seen from the direction of operation.

In an embodiment, the first section and the second section of the sample carrier fixing element form at least a part of a resilient element. This resilient element may be fixed to the body of the sample holder or be an integral part of the sample holder. The resilient element may have one or a plurality of first sections in order to fix one or a plurality of sample carriers to the sample holder. The resilient element may further have one or a plurality of second sections in order to switch the corresponding first section(s) at least from one position into another. It is, however, also possible to only have one second section and two or more first sections for fixing two or more sample carriers to the sample holder. The first section(s) may be arranged at one end of the resilient element, while the second section(s) are arranged at another, preferably the opposite end of the resilient element. Preferably, the first section(s) are implemented in the form of leaf spring(s) biased towards the first position, such that, by operating the second section(s), preferably, the second section, the first section(s) are moved into the second open position(s) and return by itself back into the first position without the need of operating the second section(s). The operation of the second section(s) is preferably done by a compressive or pushing force exerted onto the second section(s).

In this embodiment, it is preferred if the resilient element is configured such that the second section is operable by exerting an operating force onto the second section, as discussed above, and more preferably such that the first section of the sample carrier fixing element assumes its first position (fixing position) in absence of such an operating force or in presence of the operating force being less than a predetermined force onto the second section of the sample carrier fixing element, and such that the first section assumes its second position (open position) upon the operating force being at least equal to the predetermined force onto the second section. In a preferred embodiment, the operating force is a compressive force, such that upon a predetermined compressive or pushing force onto the second section of the resilient element, the first section is caused to move into its second open position. In this position, a sample carrier can be inserted into or onto the sample holder. By releasing the operating/pushing force, the first section automatically returns in its first position in order to fix the sample carrier to the sample holder.

In an embodiment, the resilient member is, at least partially, formed of or comprises a metal, preferably a copper alloy, more preferably copper-beryllium, e.g. CuBe2 (EN-CW101C).

It should be noted that the sample carrier fixing element may, in principle, be configured such that its first section, when in its first position, is able to fix the sample carrier to the sample holder without any further additional means. To this end, the first section may comprise, at least partially, a circumferential groove or notch or clip engageable with the outer periphery or with the external circumference of the sample carrier such that the first section, in its first position, fixes the sample carrier to the sample holder. On the other hand, securing of the sample carrier may be achieved or at least enhanced by interaction of the first section of the sample carrier fixing member with a geometry of a contact surface of the sample holder, the contact surface providing support for the sample carrier.

In such an embodiment, the sample holder comprises a contact surface providing support for the sample carrier, said contact surface being preferably formed in a recess or recessed area of the sample holder. In this embodiment, the contact surface has a shape, which, at least partially, corresponds to the shape of the sample carrier when inserted in the recessed area of the sample holder. With such a configuration, the first section of the sample carrier fixing element serves the purpose of additionally securing the sample carrier in its position such that, even if the sample holder/cartridge is e.g. turned upside down, the sample carrier will remain in its position.

In a preferred embodiment, the recess or the recessed area of the sample holder is configured such that the sample carrier is clamped between the first section of the sample carrier fixing element and a sidewall of the recess, when the first section is in its first position. If the first section is (a part of) a resilient element, the spring tension acts in a direction parallel and/or onto the main surface of the sample carrier.

Furthermore, in a preferable embodiment the recess or the recessed area further comprises an undercut configured to receive a part of the outer circumference or outer periphery of the sample carrier. This results in an even safer securing of the sample carrier to the sample holder. To this end, the first section of the sample carrier fixing element, in its first position, and the undercut are preferably configured such that the sample carrier is clamped between the first section and the undercut.

It should be noted that the above features of the embodiments can—wholly or in part—be combined to achieve other embodiments still falling under the scope of the present invention.

As used herein, the term "and/or" includes any and all combinations of one or more of the associated listed items and may be abbreviated as "/".

Although some aspects have been described in the context of an apparatus or device, it is clear that these aspects also represent a description of a method of operating such an apparatus or device.

Further embodiments and their advantages are described below in connection with the following figures.

In the following, the figures are described comprehensively, same reference signs designating same or at least structurally identical components.

FIG. 1 schematically shows in a perspective view a sample holder 100 for holding a sample carrier 120 carrying a sample. The sample carrier 120, in this embodiment, is a so-called "autogrid," i.e. a metal mesh/grid including a carbon carrier web and a snap ring/metal frame around its outer circumference (see FIG. 3). It should be noted that also other kinds of sample carriers can be used. The autogrid 120 may carry a vitrified sample, which is to be processed/examined. In cryo-microscopy, the sample is first examined by cryo-light microscopy in order to locate relevant regions of the sample; the sample is then further processed in order to be prepared for being examined by a cryo-electron microscope. The relevant regions of the sample are then relocalised and examined in high magnification and resolution in a cryo-electron microscope. The sample holder 100 serves the purpose of transferring the sample between the different processing and/or analysing units.

As can be seen from FIG. 1, the sample holder 100 comprises a contact surface 140 for supporting the sample carrier 120. In the example shown, only one sample carrier 120 is inserted in the corresponding sample carrier area 142 of the sample holder 100, while the other sample carrier area 142 is (still) empty for illustrative purposes. The contact surface 140 is formed in the recessed area 142 of the sample holder 100 such that the sample carrier 120 fits into the recessed area. For the subsequent workflow, it is, however, important that the sample carrier 120 is placed in the right orientation onto the recessed area 142 of the sample holder 100 and to fix or secure the sample holder in this position. The sample holder 100 enables positioning and orientating of the sample carrier 120 before fixing/securing it in its position.

The sample holder 100 comprises a sample carrier fixing element 130, which, in this embodiment, is fixed to the body of the sample holder 100 by a screw. The sample carrier fixing element 130 comprises two sections, namely an upper first section 132 and a lower second section 134. The first section 132 serves the purpose to fix or secure the sample carrier 120 in its position on the sample holder 100. As can be seen from FIG. 1, the sample carrier fixing element 130 comprises two such first sections for receiving and fixing two sample carriers 120. The second section 134 is assigned to both first sections 132. In other words, by operating the second section 134, the first sections 132 can be switched from a first position to a second position. In its first position, the first section 132 fixes the sample carrier 120 to the sample holder 100 as shown in FIG. 1. In its second position, the first section 132 releases the sample carrier 120 (see FIG. 2b). If no sample carrier 120 is present (see also FIG. 1), the first section 132 in its second position provides access to the area 142 where the sample carrier 120 is to be located.

In the embodiment of FIG. 1, the second section 134 of the sample carrier fixing element 130 is operable by exerting a compressive force onto the second section 134 as illustrated by a pushing element 150 (of this or any other form). If the pushing force exerted by the pushing element 150 exceeds a predetermined force Fs, the first section 132 is caused to move from its first position into its second position such that the sample carrier 120 is released and such that access to the recessed area 142 where another sample carrier 120 can be located is provided, respectively. In the embodiment shown, the first sections 132 and the second section 134 form a part of a resilient element 136 such that pushing of the second section 134 leads to a movement of the first sections 132 in an essentially opposite direction (see also FIG. 2b). By such a construction, the operation of the sample carrier fixing element 130 can be decoupled from the function of the sample carrier fixing element. The direction of pushing/operating the second section 134 is different from and essentially opposite to the direction of the first section 132 moving into its second open position.

As long as a compressive or pushing force exceeding the predetermined force Fs is exerted onto the second section 134 by the pushing element 150, the first section 132 remains in its second open position. In this situation, a user can insert a sample carrier 120 into the recessed area 142 and properly orientate the sample carrier 120. Same is true for another sample carrier 120, which is to be placed onto the sample holder shown in FIG. 1. Only after having properly placed and oriented the sample carrier(s) 120, the pushing force or the pushing element 150 is removed such that the compressive force is lowered below the predetermined force Fs causing the first section 132 to automatically move in the first position where the sample carrier 120 is fixed to the sample holder 100.

The securing effect may be further improved by an undercut 144 provided in the recessed area 142, which undercut 144 is in an area opposite to the first section 132 of the sample carrier fixing element 130. The undercut 144 is configured to receive a part of the outer circumference of the sample carrier 120, such that, if the first section 132 is in its first position, the sample carrier 120 is clamped between the first section 132 and the undercut 144.

In the embodiment shown in FIG. 1, the sample carrier fixing element 130 comprises a resilient element 136 including the first section 132 and the second section 134 at opposite ends of the resilient element 136. The resilient element 136 is configured, as already explained above, such that the first section 132 moves (or pivots) when the second section 134 is moved (or pivoted) by a compressive or pushing force.

Figure 2A:
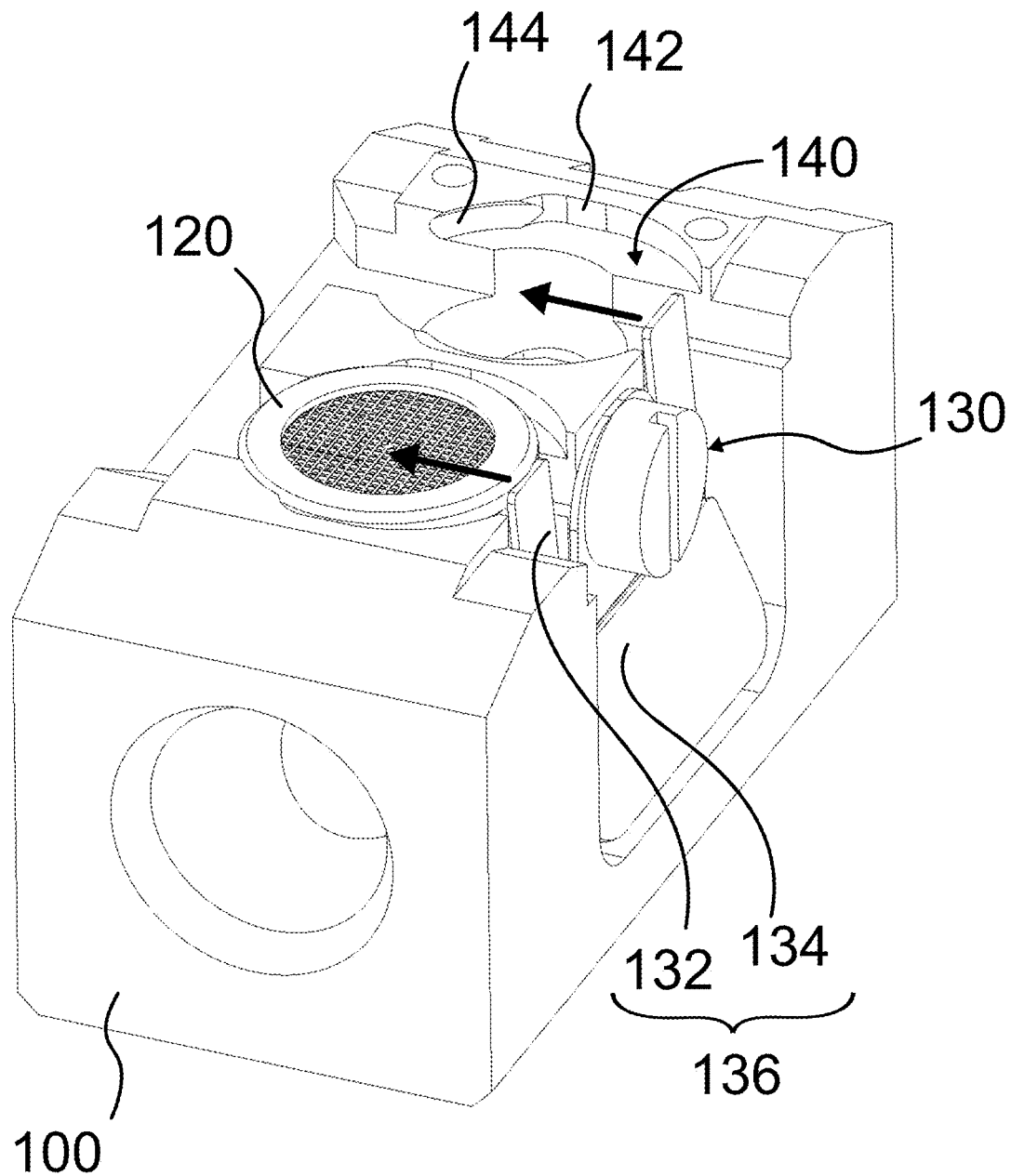
FIG. 2a schematically shows a sample holder according to an embodiment of the present invention, the first section of the sample carrier fixing element of the sample holder being in its first fixing position.
Figure 2B:
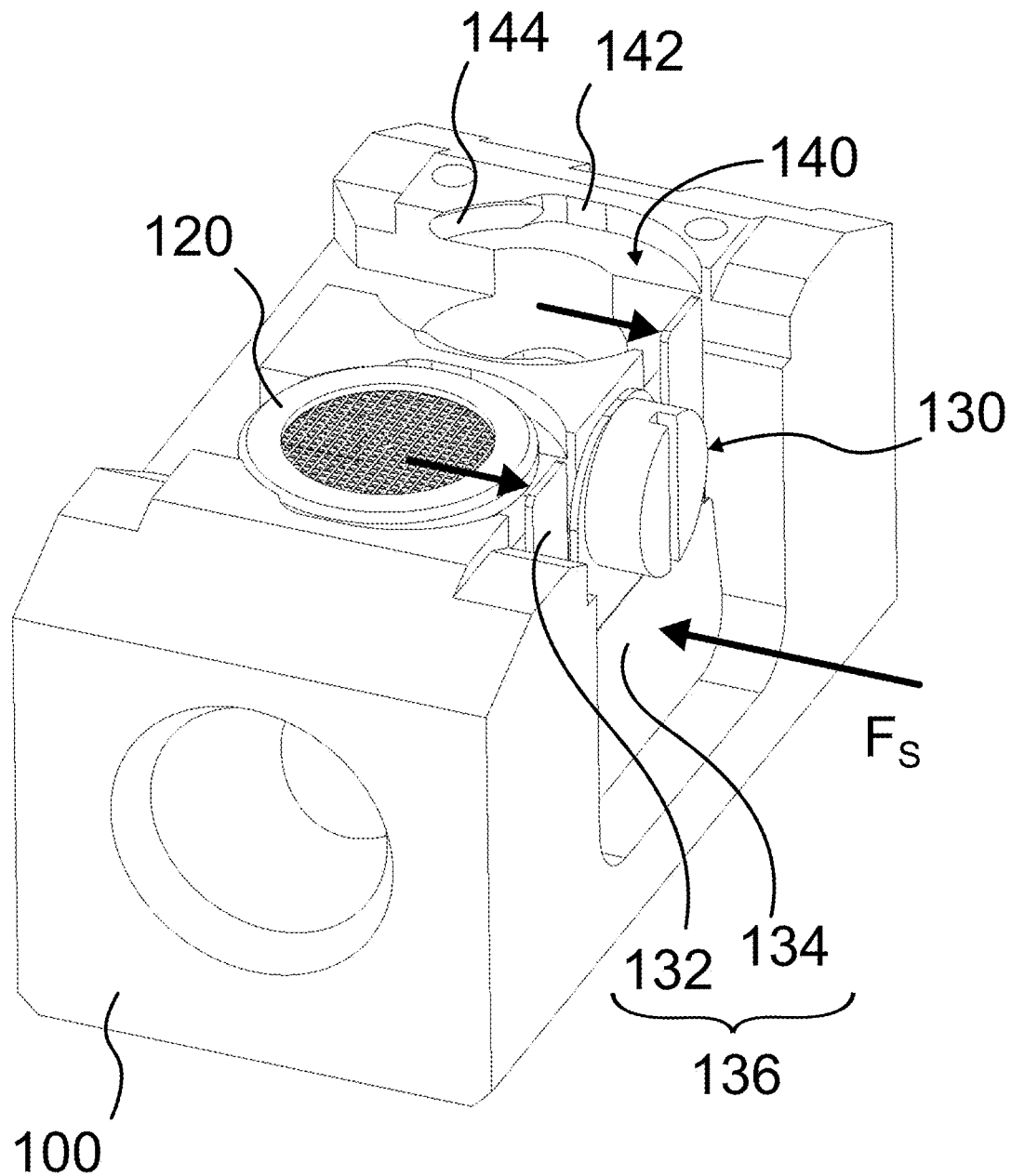
FIG. 2b schematically shows a sample holder according to an embodiment of the present invention, the first section of the sample carrier fixing element of the sample holder being in its second open position.

FIGS. 2a-b schematically show a similar sample holder 100 as the one of FIG. 1. FIG. 2a shows the sample holder 100 carrying a sample carrier 120 with the first section 132 of the sample carrier fixing element 130 in the first closed position, while FIG. 2b shows the sample holder 100 carrying a sample carrier 120 with the first section 132 of the sample carrier fixing element 130 in its second open position. As can be seen from FIGS. 2a and 2b, the sample carrier fixing element 130 comprises a resilient element including two first sections 132 and a single second section 134 at opposite ends of the resilient element 136, the resilient element being configured in a lever-like fashion such that the first sections 132 pivot (or move) in the second open position when the second section 134 is pivoted (or moved) by a pushing force exerted onto said second section as shown by the arrows in FIG. 2b. The resilient element 136 essentially has the form of a leaf spring, the leaf spring part of the first section 132 of the resilient element 136 being biased towards the area 142 where the respective sample carrier 120 is to be located. With such a configuration, when no external force acts upon the second section 134 (see FIG. 2a), the first sections 132 pivot (or move) by itself into the first fixing positions, as illustrated by the arrows in FIG. 2a.

The sample holder 100 shown in FIGS. 2a-b provides an easy and user-friendly handling of sample carriers 120 because it is no longer necessary to insert a sample carrier 120 from essentially the same direction as the main direction of movement of the first sections 132, when the first sections 132 move into the second open positions. In contrast, the main direction of operation, as can be seen in FIG. 2b, is a direction opposite to the main direction of movement of the first sections 132 into the second open position. Thus, the process of opening the sample carrier fixing element is independent from the process of inserting a sample carrier 120.

Figure 3:
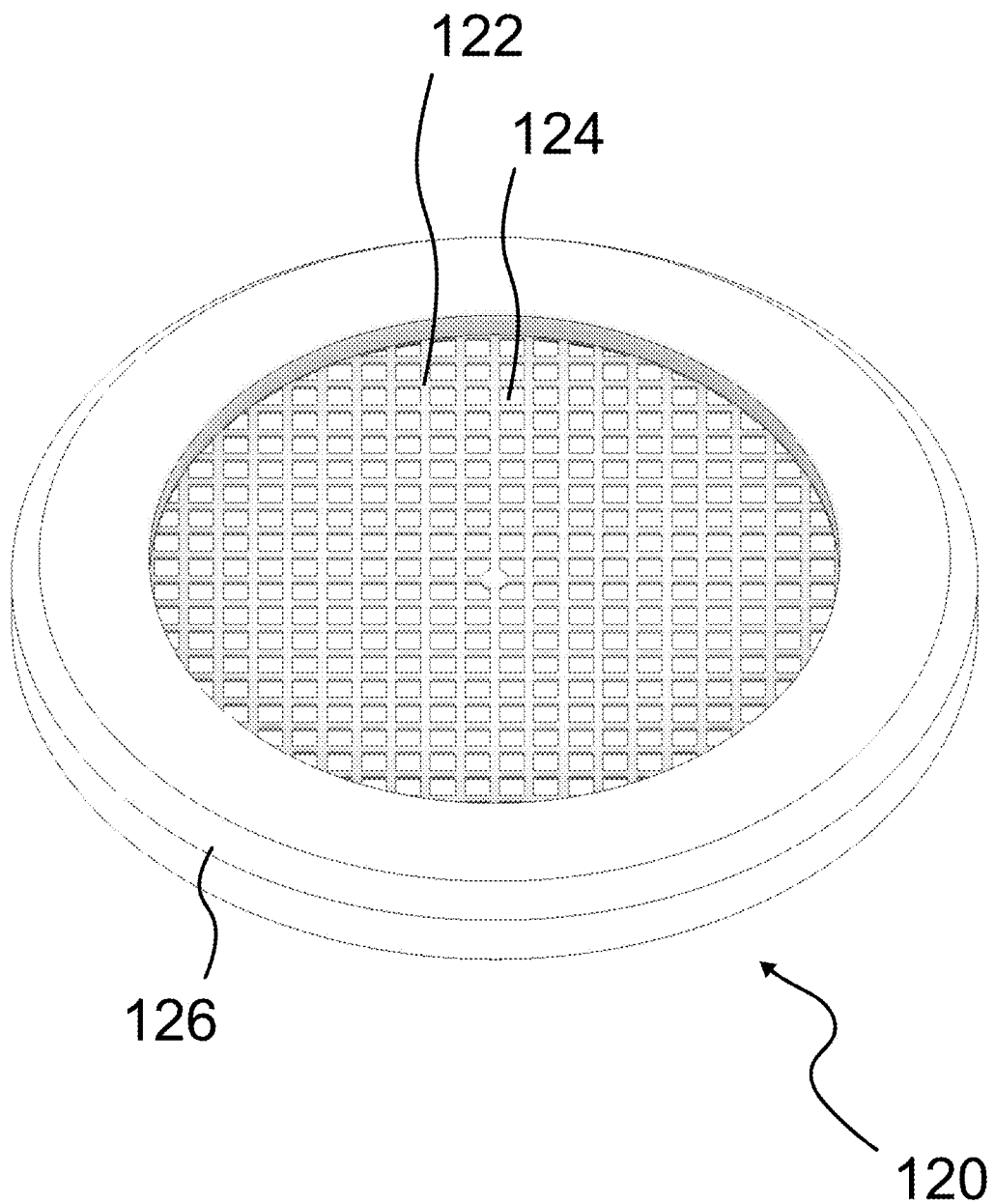
FIG. 3 schematically shows a sample carrier suitable to be used in a sample holder according to an embodiment of the present invention.

FIG. 3 schematically shows a sample carrier 120 suitable to be used in a sample holder 100 of FIGS. 1 and 2a-b. The sample carrier 120, in this embodiment, is a so-called "autogrid" and includes a grid suitable for transmission electron microscopy (TEM), e.g. a thin film 124 of carbon on a metal grid 122, enclosed by a metal frame 126. A biological sample (not shown) placed onto the grid is vitrified and the grid is then fixed into the surrounding metal frame 126 by means of a snap ring.

As can be best seen e.g. from FIGS. 3 and 2a, the undercut 144 of the sample holder 100 is configured to receive a part of the outer circumference of the sample carrier 120 on the other side of the respective first section 132 of the sample carrier fixing element 130 such that, in its first closed position, the sample carrier 120 is clamped between the first section 132 and the undercut 144 and thus safely secured in its position.

Figure 4A:
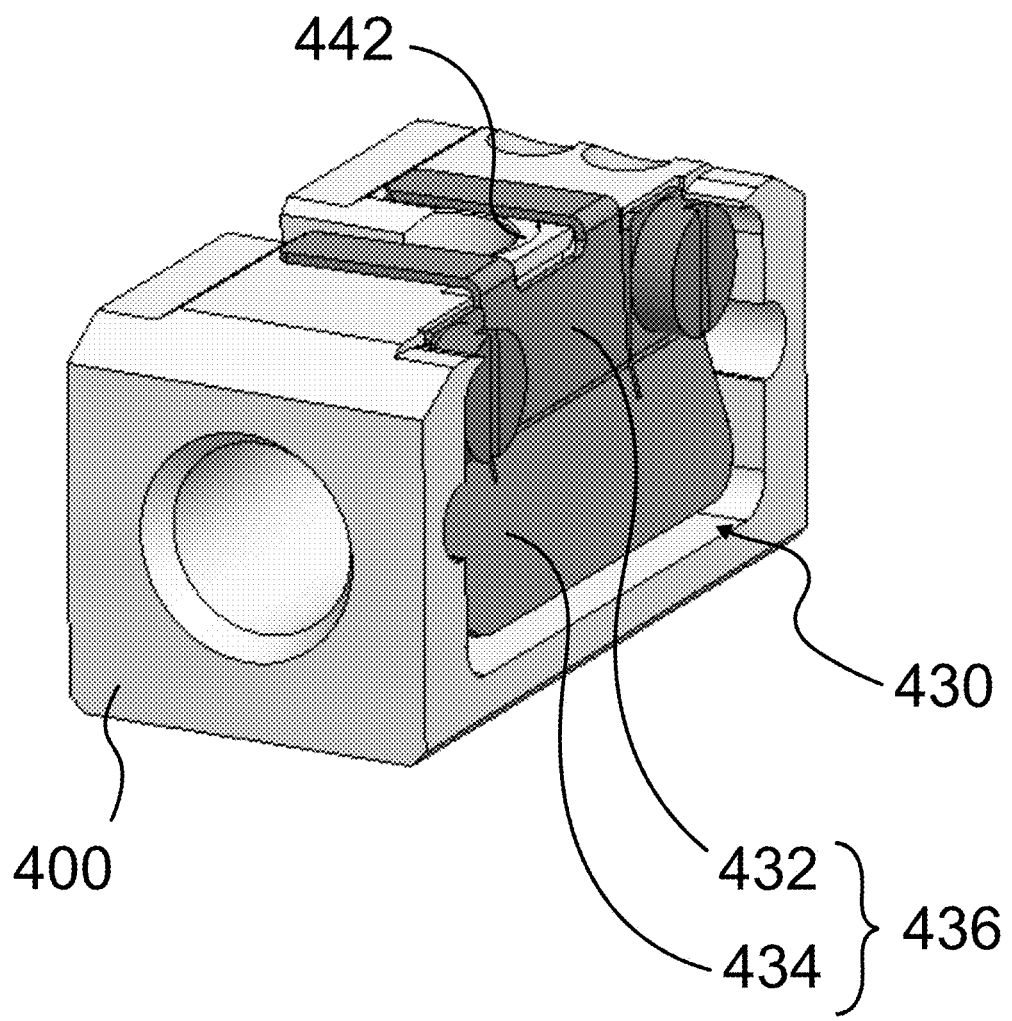
FIG. 4a schematically shows a sample holder according an embodiment of the present invention suited particularly for different types of sample carriers, the sample carrier fixing element being in its first fixing position without a sample carrier.
Figure 4B:
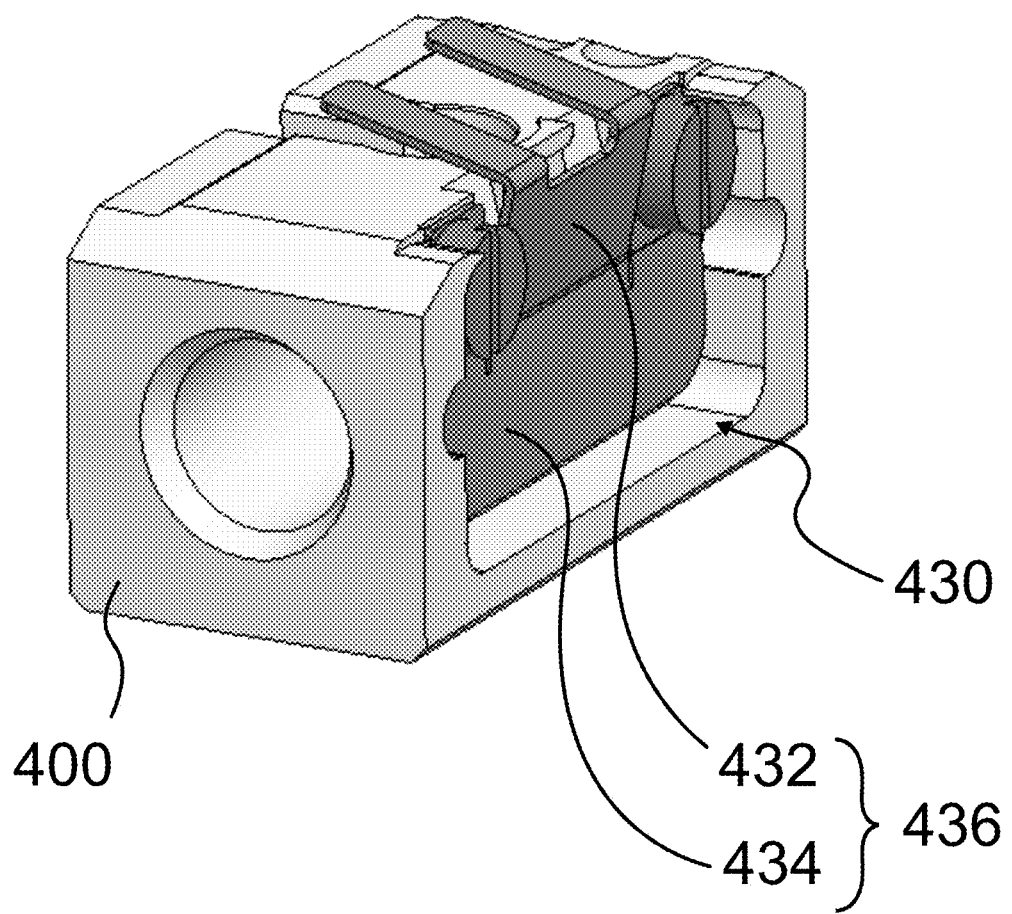
FIG. 4b schematically shows a sample holder according an embodiment of the present invention suited particularly for different types of sample carriers, the sample carrier fixing element being in its second open position without a sample carrier.
Figure 4C:
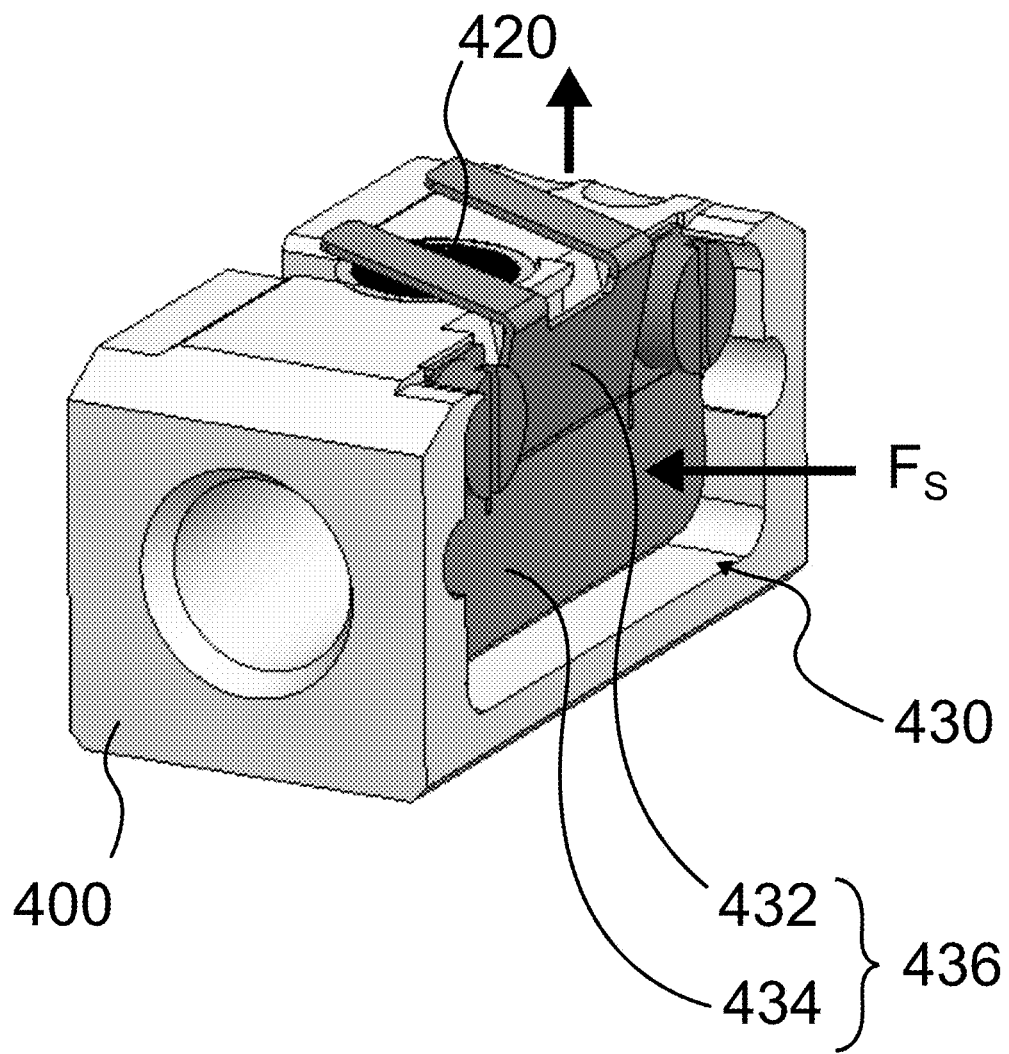
FIG. 4c schematically shows a sample holder according an embodiment of the present invention suited particularly for different types of sample carriers, the sample carrier fixing element being in its second open position with a sample carrier.
Figure 4D:
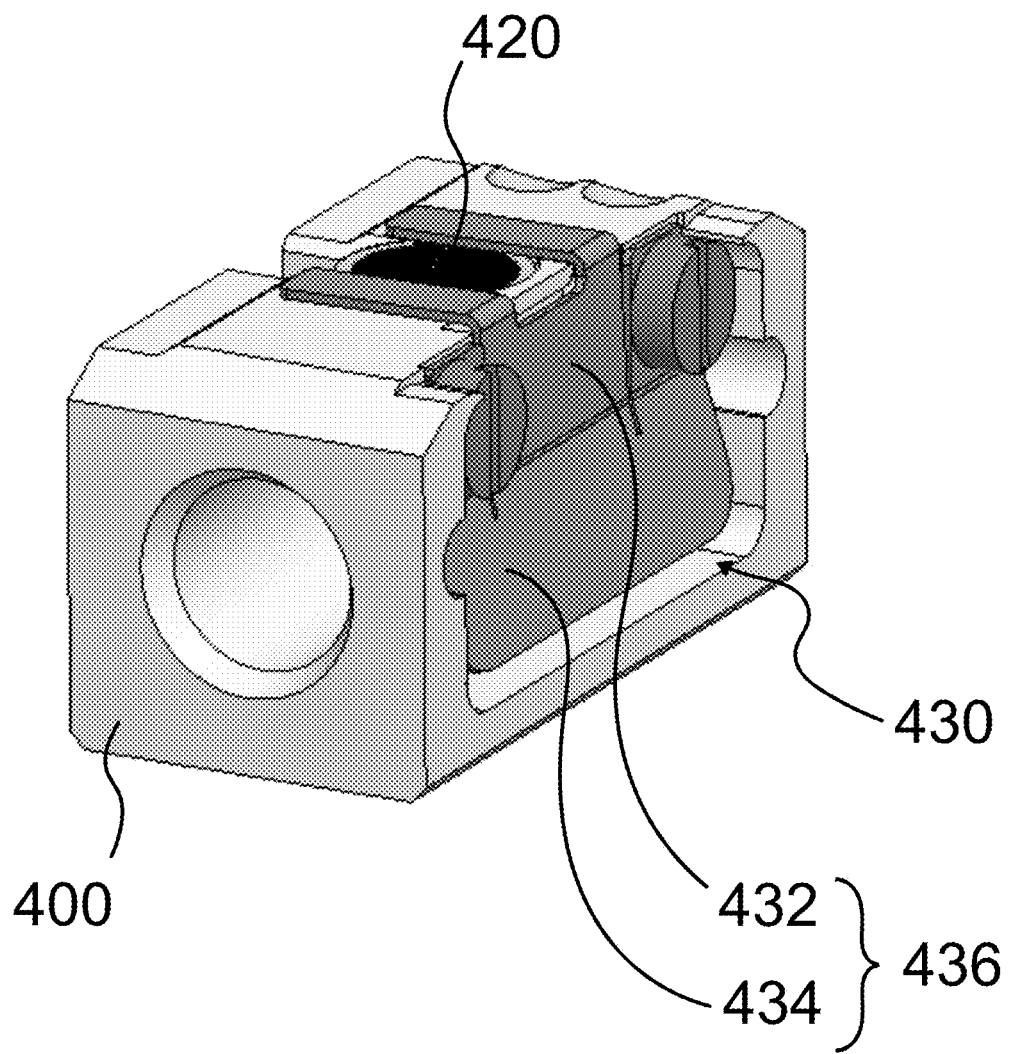
FIG. 4d schematically show a sample holder according an embodiment of the present invention suited particularly for different types of sample carriers, the sample carrier fixing element being in its first fixing position with a sample carrier.

FIG. 4a-d schematically show a sample holder 400 according to another embodiment of the present invention, particularly suited for use with so-called "baregrids" as sample carriers 420. Such "baregrids" are similar to the "autogrids" as discussed above but lack a metal frame. Such sample carriers 420 can be secured in its position as shown in FIG. 4d by using a first (upper) section 432 of a sample carrier fixing element 430 in its first closed position, the first section 432 comprising a bifurcated part including two tabs, which extend along the two sides and above at least a part of the upper surface of the sample carrier 420 as illustrated in FIG. 4d. In this case, the fixing force of the first section 432, namely its bifurcated part, mainly acts in a direction "from above downward," i.e. perpendicular to the main surface of the sample carrier 420. In other embodiments the first section 432 may also comprise only one tab or more than two tabs.

In order to release the sample carrier 420, the second section 434 can be operated by exerting a compressive force of at least a predetermined force Fs onto the second section 434 such that the first section 432 moves into its second open position. The direction of this movement as shown in FIG. 4c is mainly an upward direction with a smaller component in a backward direction. Thus, the second section 434 of the sample carrier fixing element 430 is operated from a direction essentially perpendicular to the main direction of the first section 432 moving into its second open position (see arrows in FIG. 4c).

FIGS. 4a and 4b show the same sample holder 400 as FIGS. 4c and 4d but without a sample carrier 420 inserted into the sample holder 100. In order to insert a sample carrier 420, the sample carrier fixing element 430 of the sample holder 400 shown in FIG. 4a can be "opened" by exerting a pushing force of at least Fs onto the second section 434 such that the first section 432 switches into the second open position as shown in FIG. 4b in order to provide access to an area 442 where the sample carrier 420 is to be located. After having inserted the sample carrier 420 into the area 442, while maintaining a compressive force at least equal to the predetermined force Fs onto the second section 434 as shown in FIG. 4c, the compressive force can be released such that the sample carrier fixing element 430 assumes the form shown in FIG. 4d. In this situation, the sample carrier 420 is safely secured in the sample holder 400 and can be transferred to a processing and/or analysing unit.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS 100 sample holder
120 sample carrier
122 metal grid
124 carbon carrier web
126 metal frame
130 sample carrier fixing element
132 first section
134 second section
136 resilient element
140 contact surface 142 sample carrier area
144 undercut
150 pushing element
400 sample holder
420 sample carrier
430 sample carrier fixing element
432 first section
434 second section
436 resilient element
440 contact surface
442 sample carrier area

The invention claimed is:

1. A sample holder for holding a sample carrier carrying a sample, the sample holder comprising: a sample carrier fixing element comprising:
   a first section configured, when in a first position, to fix the sample carrier to the sample holder, and, when in a second position, to release the sample carrier or to provide access to an area where the sample carrier is to be located, and
   a second section different from the first section, the second section being operable such that upon operation of the second section the first section switches from the first position into the second position or from the second position into the first position.

2. The sample holder according to claim 1, wherein the second section of the sample carrier fixing element is operable from a direction different from the direction of the first section moving into the second position.

3. The sample holder according to claim 1, wherein the sample carrier fixing element comprises a rigid element being configured to have a function of a lever or being formed as the lever, such that the sample carrier fixing element is pivotable around an axis between the first section and the second section such that the first section moves or pivots when the second section is moved or pivoted.

4. The sample holder according to claim 1, wherein the sample carrier fixing element comprises a resilient element having the first section and the second section, the resilient element being configured such that the first section moves or pivots when the second section is moved or pivoted.

5. The sample holder according to claim 4, wherein the resilient element is configured such that the second section is operable by exerting an operating force onto the second section.

6. The sample holder according to claim 5, wherein the resilient element is configured such that the first section of the sample carrier fixing element assumes the first position in absence of the operating force or in presence of the operating force being less than a predetermined force onto the second section of the sample carrier fixing element, and such that the first section assumes the second position upon the operating force being at least equal to the predetermined force onto the second section.

7. The sample holder according to claim 4, wherein the resilient element at least partially comprises a metal or a copper alloy or copper-beryllium.

8. The sample holder according to claim 1, wherein the sample holder comprises a contact surface providing support for the sample carrier, the contact surface being formed in the area of the sample holder where the sample carrier is to be located.

9. The sample holder according to claim 8, wherein the first section of the sample carrier fixing element, in the first position, and the area of the sample holder are configured such that the sample carrier is clamped between the first section and a sidewall of the area.

10. The sample holder according to claim 8, wherein the area further comprises an undercut configured to receive a part of an outer circumference of the sample carrier.

11. The sample holder according to claim 10, wherein the first section of the sample carrier fixing element, in the first position, and the undercut are configured such that the sample carrier is clamped between the first section and the undercut.

12. The sample holder according to claim 1, wherein the first section of the sample carrier fixing element is in a form of a leaf spring or comprises the leaf spring.

13. The sample holder according to claim 12, wherein the leaf spring of the first section is biased in the direction of the area where the sample carrier is to be located.

14. The sample holder according to claim 1, wherein the first section of the sample carrier fixing element comprises a bifurcated part or one or more tabs.

15. The sample holder according to claim 14, wherein the bifurcated part or the one or more tabs of the first section are biased downwards in the direction of the area where the sample carrier is to be located.

16. The sample holder according to claim 4, wherein the resilient element has the first section and the second section at opposite ends of the resilient element.

* * * * *